United States Patent [19]

Schulz, Sr.

[11] 4,325,780

[45] Apr. 20, 1982

[54] METHOD OF MAKING A PRINTED CIRCUIT BOARD

[76] Inventor: Robert M. Schulz, Sr., 737 N. Albany Ave., Chicago, Ill. 60612

[21] Appl. No.: 187,811

[22] Filed: Sep. 16, 1980

[51] Int. Cl.[3] .................................................. C23F 1/02
[52] U.S. Cl. .................................... 156/659.1; 29/852; 156/661.1; 156/902; 174/68.5; 204/24; 427/97; 430/313; 430/318
[58] Field of Search ............................. 156/629–630, 156/632, 634, 659.1, 645, 661.1, 666, 901, 902; 427/96, 97; 29/825, 846, 852, 874; 430/312, 313, 314–316, 318, 319; 204/15, 24; 174/68.5

[56] References Cited

U.S. PATENT DOCUMENTS

| 2,861,029 | 11/1958 | Bain et al. | 156/634 X |
| 3,742,597 | 7/1973 | Davis | 427/97 X |
| 3,772,101 | 11/1973 | Chumbres et al. | 156/11 |
| 4,024,631 | 5/1977 | Castillero | 29/615 |
| 4,104,111 | 8/1978 | Mack | 156/656 |

Primary Examiner—William A. Powell
Attorney, Agent, or Firm—John S. Fosse

[57] ABSTRACT

A printed circuit board is manufactured by preparing a dielectric substrate with copper-clad surfaces, applying an etch-resist layer in a positive image of the circuit trace, etching away the exposed, non-circuit copper surfacing, and thereafter removing the etch-resist material.

8 Claims, 14 Drawing Figures

METHOD OF MAKING A PRINTED CIRCUIT BOARD

FIELD OF THE INVENTION

This invention relates generally to the art of mass-produced printed circuits and more particularly to methods of manufacturing board-supported printed circuits without subjecting the product either to fluxing chemicals or to an immersion in molten metal baths.

BACKGROUND OF THE INVENTION

A number of popular prior art methods of manufacturing printed circuit boards include the steps of fluxing the prepared board and dipping it into molten solder, despite the obvious disadvantages flowing from the resultant chemical contamination, thermal shock and possibility of molten metal migration. Other prior art procedures attempt to avoid these difficulties by electrolytically depositing the solder or other metal that is ultimately to be used in attaching the leads of such circuit components as capacitors, resistors, diodes and the like to the printed circuit board. However, the prior art methods which eliminate molten solder dipping employ a layer of solder, nickel, or other suitable metal over the entire circuit board as an etch-resist. These schemes risk short-circuiting of densely packed circuit designs when the plated solder is heat-reflowed or when the excess copper is etched away and tend to introduce unwanted expense.

SUMMARY OF THE INVENTION

Therefore, the present invention takes as an important object the provision of a new and improved method of making printed circuit boards which overcomes the deficiencies of the prior art by etch-forming instead of depositing the circuit trace.

Another important object of the invention is to provide a method of making precision printed circuit boards in a highly economical manner which eliminates the application of metallic etch-resists and broad areas of solder or the like.

Still another object of the invention is to provide a simple, low-cost method of making printed circuit boards.

These and other objects and features of the invention will become more apparent from a consideration of the following descriptions.

BRIEF DESCRIPTION OF THE DRAWINGS

In order that the principles of the present invention may be readily understood, a single embodiment thereof is shown in the accompanying drawings wherein.

DETAILED DESCRIPTIONS

Figure 2:
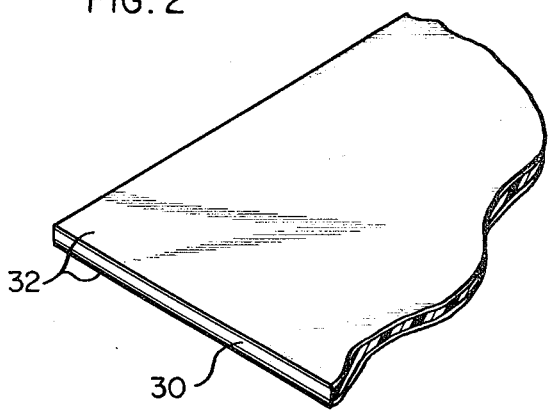
FIG. 2 is a fragmentary perspective view shown approximately actual scale and illustrating a selected copper-clad substrate for use in the method of the present invention.
Figure 4:
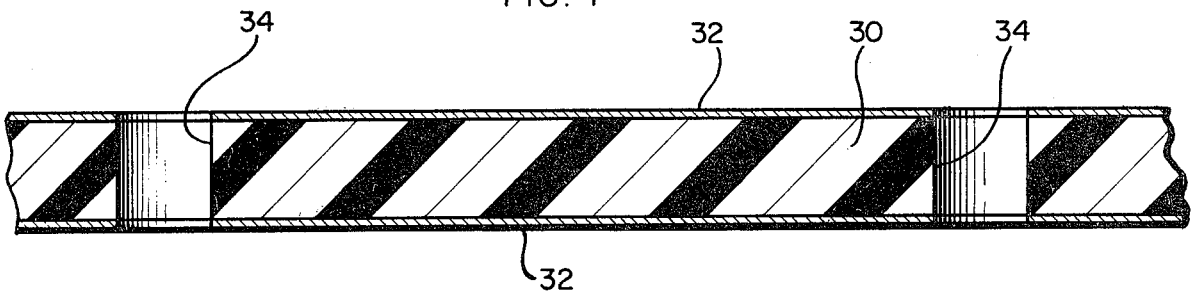
FIG. 4 is an enlarged, cross-sectional view taken substantially along the line 4—4 of FIG. 3.

In the practice of the manufacturing method of the present invention, a dielectric substrate is first prepared to receive one or more planar circuitry arrangements; and advantageously, a suitably clad insulation board, indicated generally throughout the figures by the reference numeral 30, is selected to possess the requisite physical and electrical properties. In accordance with conventional practice, the board 30 is fabricated as a glass fiber reinforced epoxy resin layup or laminate; and such a product is known to be dimensionally stable, strong, lightweight and possessed of good electrical properties. An electrically conductive material is selected to surface at least one side and preferably both sides of the board 30; and advantageously, the electrically conductive surfacing comprises copper foil layers 32 which are laminated on both sides of the insulation board 30, as is shown in FIGS. 2 and 4. The gauge of the copper foil is selected to provide thickness and conductive properties suitable for the intended circuit application. Copper foil having a thickness of from 15 to 30 ten-thousandths of an inch has proved eminently suitable for most purposes. Copper foil laminations are preferred to chemically plated layers because the latter requires a treatment that is comparatively time-consuming and uneconomical.

Figure 1:
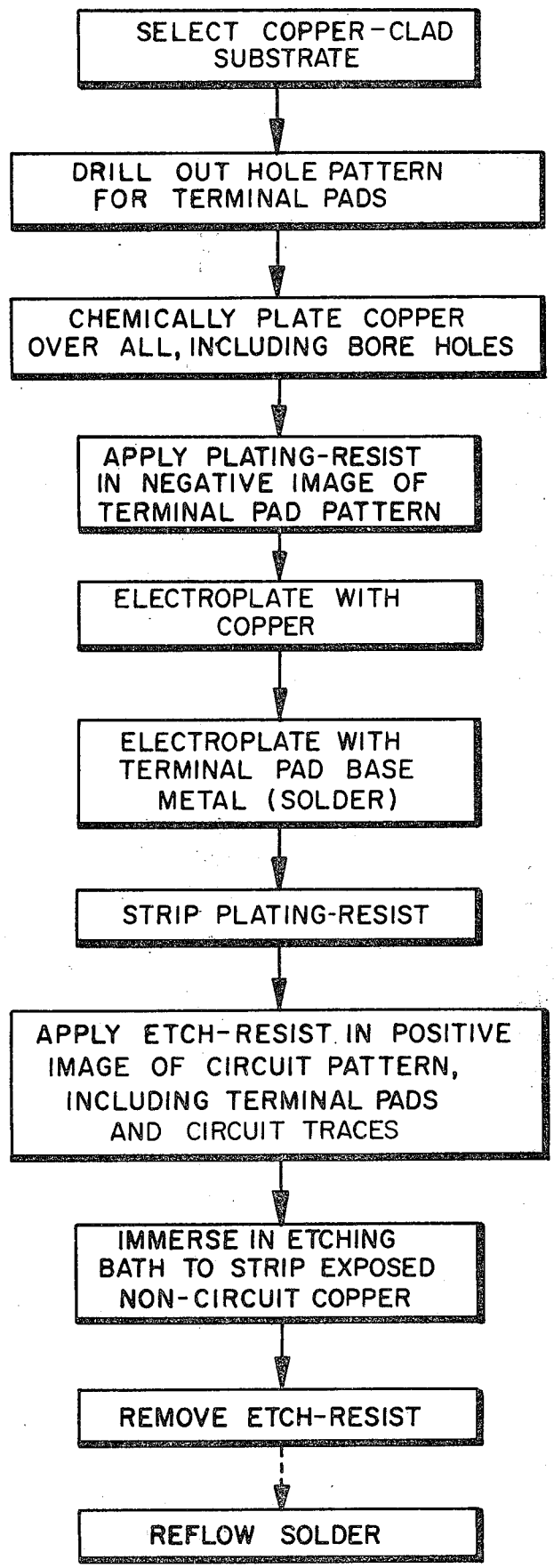
FIG. 1 is a schematic block diagram showing the sequence of processing steps employed in the present invention.
Figure 3:
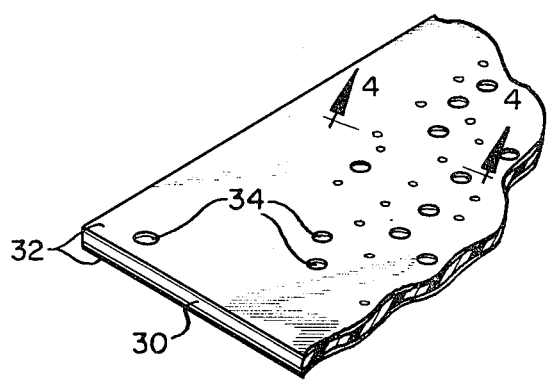
FIG. 3 is a view similar to the showing of FIG. 2 but illustrating the substrate board after the hole pattern for circuit terminal pads has been drilled out.

Processing of the substrate dielectric board 30 is outlined in the block diagram of FIG. 1 to which reference will be continued throughout the following descriptions; and preparation of the copper-clad board is furthered by drilling out the substrate with either a universal or a specific terminal pad pattern for the circuitry trace, a plurality of bore holes 34 first shown in FIGS. 3 and 4 illustrating such perforation. It is to be recognized that such drilling out of the circuit board is of particular advantage when both surfaces of the board are clad with electrically conductive material, the bore holes affording a means of making electrical connection between separate circuits formed on the top and bottom surfaces of the board in fabricating very densely packed circuits, as is suggested in the drawings. The bore holes 34 provide sites for use in attaching the leads or electrodes of the various circuitry components in the conventional manner. It is to be understood that when the substrate board is clad on both sides, the respective circuit patterns can be developed in simultaneous process steps.

Figure 5:
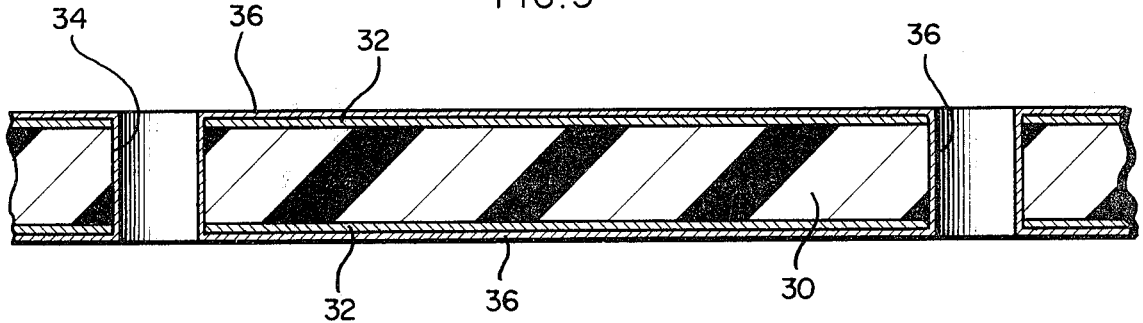
FIG. 5 is a view similar to the showing of FIG. 4 but illustrating the pre-drilled board or substrate after it has been chemically plated overall with metallic copper, including the bore holes.
Figure 6:
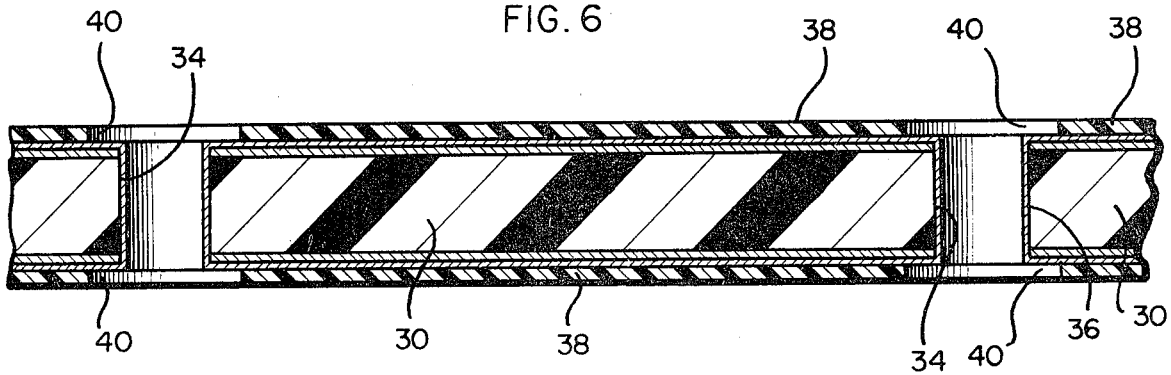
FIG. 6 is a sectional view similar to the showing of FIGS. 4 and 5 but illustrating the substrate board after plating-resist material has been applied in a negative image of the circuitry terminal pad pattern, taken substantially along the section line 6—6 of FIG. 7.
Figure 7:
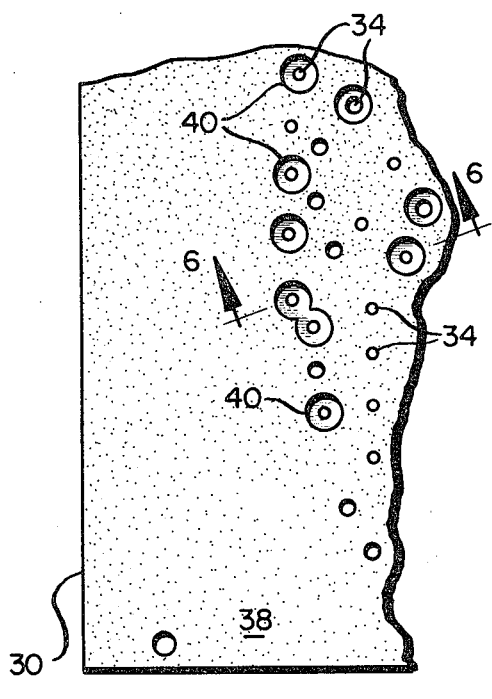
FIG. 7 is a fragmentary perspective view showing the substrate board with the plating-resist material in place.

After the board 30 has been drilled in the desired pattern, it is cleaned to remove the drilling debris and is thereafter sensitized and chemically flash plated overall with an ultra-thin layer of copper or other electrically conductive metal, and especially on the walls of the drilled holes 34. This chemical flash plating produces the ultra-thin layer 36 shown in FIG. 5, and plating of the walls of the drilled holes 34 makes electrical connection between the copper-clad surface layers 32 and provides an electrically conductive foundation in the bore holes for the subsequent electrolytic deposition of suitable terminal pad base metal such as a tin-lead solder alloy. After the ultra-thin layer of copper is chemically plated on the dielectric substrate, such cleaning as is necessary is performed and then the electrically conductive surfaces are coated with a layer of plating-resist film in a pattern having open regions which correspond to the intended terminal pad pattern, i.e. the plating-resist is applied in a negative image. Advantageously, a silk-screen printing mask is employed for this purpose; and the plating-resist may comprise any one of the number of commercially available solvent or chemically strippable organic coatings. The film 38 of plating-resist material is shown in FIG. 6 where the open regions for the terminal pads or lands 40 are shown taking greater diameter than the bore holes 34. Moreover and considering FIG. 7 in particular, it will be noted that not all of the bore holes 34 are associated with a terminal pad opening or land 40 on the illustrated face of the substrate board 30. As will be recognized, such is frequently the case when a universal design circuit board is employed for a variety of circuit traces or when the substrate board is fashioned with dissimilar or asymmetrical circuit traces on its respective faces or when landless through-holes are desired.

With the plating-resist material in place, and with the exposed metal surfaces metallurgically clean, the substrate board 30 is immersed in an electroplating bath and a layer 42 of an electrically conductive material such as copper metal is deposited to the desired thickness over the terminal pad areas 40 and in the bores of the drilled holes 34. Electrodeposition of the copper or other electrically conductive material at this stage in the process affords inproved coverage of the bore holes and faster metal buildup for a given thickness than is available with electroless chemical deposition.

In continuation of the presence of the plating-resist material 38, the circuit board substrate is immersed in a second electroplating bath in order to deposit terminal pad base or fusion joint metal on the exposed metal surfaces. In the illustrated embodiment, a tin-lead solder alloy layer 44 is shown electrolytically deposited over the copper layer 42. Electrolytic deposition is of special advantage inasmuch as it avoids the difficulties inherent in fluxing and bath-applying molten solder. Thus, in the instant method, there is no gross thermal shock to the substrate board, the possibility of plugging of the drilled bore holes is avoided, and the likelihood of bridging between circuit elements and resultant shortcircuiting is minimized. In addition, elimination of the exposure to flux chemicals avoids introducing chemically active contaminants into the circuit board. The terminal pad base or fusion joint metal is commonly selected to be a tin-lead solder alloy although other electrically conductive materials may be employed, such as tin alone, silver or, in the case of computer circuit boards, gold.

Figure 9:
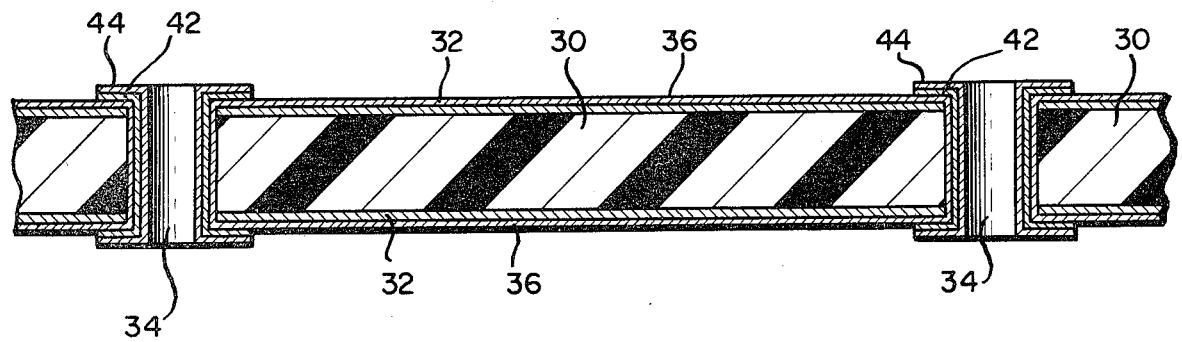
FIG. 9 is a sectional view similar to the showing of FIG. 8 but illustrating the product with the plating-resist material removed.

After plating the terminal pad base metal, the circuit board is subjected to electroless stripping of the plating-resist material 38, the resultant product being illustrated in FIG. 9.

Figure 10:
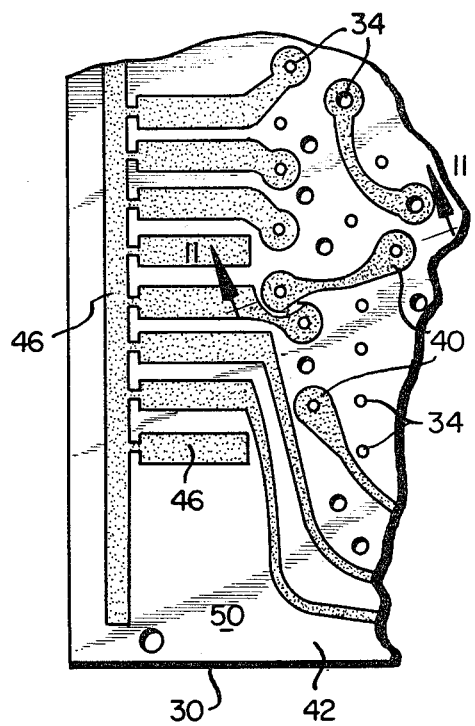
FIG. 10 is a fragmentary plan view similar to the showing of FIG. 7 but illustrating the in-process printed circuit board after the plating-resist material has been removed as is suggested in FIG. 9 and after etch-resist material has been coated on in a positive image of the circuit pattern.
Figure 8:
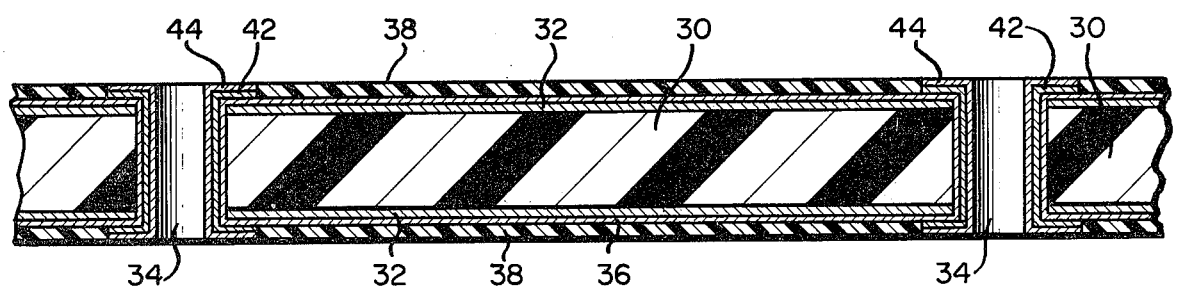
FIG. 8 is an enlarged sectional view similar to the showing of FIG. 6 but illustrating the substrate board after electroplating with copper and after electroplating with terminal pad base solder metal.
Figure 11:
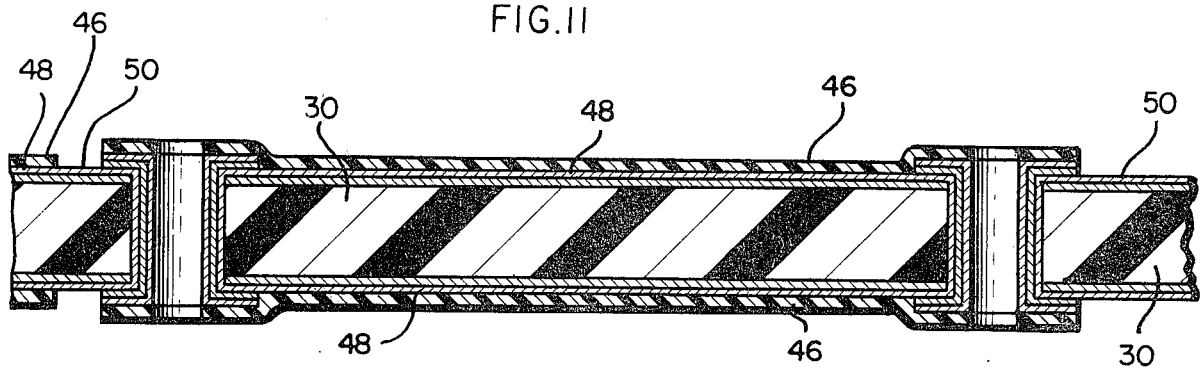
FIG. 11 is an enlarged sectional view similar to the showing of FIG. 9 but taken substantially along the section line 11—11 of FIG. 10, showing the etch-resist material selectively in place.

In particular compliance with the features of the present invention, the in-process circuit board now receives an application of silk-screen printed etch-resist material in a pattern having closed regions corresponding to the selected circuit trace, i.e. in a positive image of the circuitry. Such a procedure avoids the problem of registering an etch-resist screen with previously defined circuit patterns of electrically conductive metal. As is shown in FIGS. 10 and 11, this layer of etch-resist material 46 advantageously covers the terminal pad areas 40 and the circuit traces in order to avoid etchant undercutting and resultant risks of establishing shortcircuit pathways. This procedure avoids concurrent etching of dissimilar metals and allows precisely timed etching cycles. In FIG. 11, the protected areas of copper metal corresponding to the circuit trace are indicated by the reference numeral 48 and the areas unprotected by the etch-resist material are indicated generally by the reference numeral 50.

Figure 12:
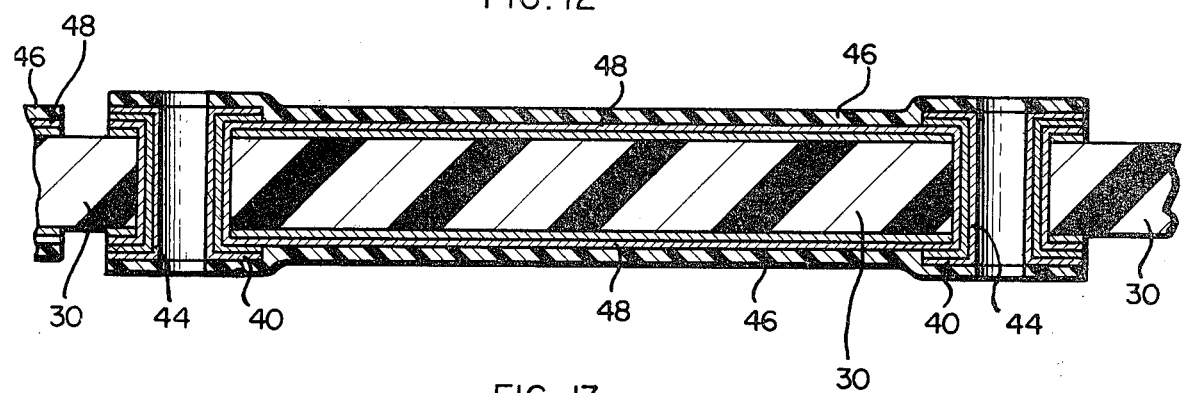
FIG. 12 is a sectional view similar to the showing of FIG. 11 but illustrating the printed circuit board after it has been immersed in etching bath to strip away exposed non-circuit copper.
Figure 13:
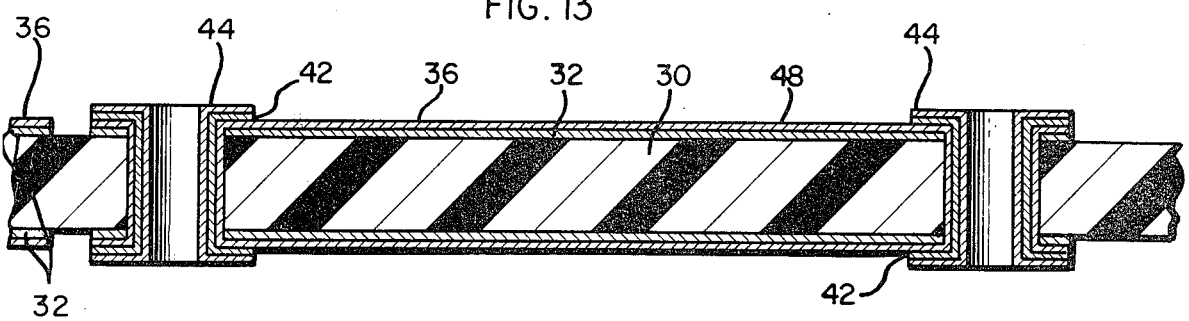
FIG. 13 is a view similar to the showing of FIG. 12 but illustrating the etch-resist material removed, taken substantially along the section line 13—13 of FIG. 14.
Figure 14:
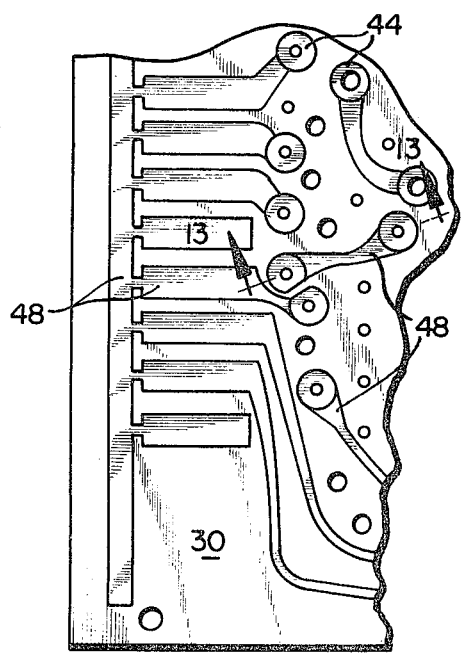
FIG. 14 is a fragmentary plan view similar to the showing of FIGS. 7 and 10 but illustrating the semi-finished circuit board with the etch-resist material removed.

Next, the circuit board substrate is immersed in an etching bath to strip away all of the exposed non-circuit copper in the regions 50. The result is shown in FIG. 12. Thereafter, the etch-resist material 46 is removed, as by chemical stripping; and the resultant board product is shown in FIGS. 13 and 14.

After the now-finished circuit board is rinsed clean and dryed, it is ready for mounting of the various circuit components or, as suggested in the last block of FIG. 1, the entire board may be heated to reflow the terminal pad metal when the latter material is selected to be a low melting point alloy such as solder. The latter procedure improves electrical contact and facilitates component mounting. Since there is no overall layer of solder or other low melting point alloy over the copper circuitry trace, such reflowing does not present a potential for short-circuiting closely proximate circuit areas in densely packed circuitry.

The specific embodiment herein shown and described is to be considered as being primarily illustrative. Various changes beyond those described will, no doubt, occur to those skilled in the art; and such changes are to be understood as forming a part of this invention insofar as they fall within the spirit and scope of the appended claims.

The invention is claimed as follows:

1. The method of making a printed circuit board which comprises the steps of: preparing a dielectric substrate having electrically conductive material surfacing at least one side thereof, including perforating the substrate with a pattern of holes corresponding with the terminal pad pattern of the intended electrical circuit; coating portions of the electrically conductive surface of the substrate with plating-resist material in a negative image of the terminal pad pattern; plating terminal pad base metal on the exposed, conductive surfaces of the substrate corresponding with the terminal pad pattern, including the walls of said holes; removing the plating-resist material; applying a layer of etch-resist material over selected portions of the electrically conductive surface of the substrate in a positive image of the circuit pattern, said etch-resist material extending over said terminal pad pattern areas to protect said areas against etching chemicals; immersing the substrate in a chemical etching bath to remove the exposed, non-circuit conductive material; removing the etch-resist material and thermally reflowing the terminal pad base metal after removal of the etch-resist material.

2. The method of making printed circuit board according to claim 1 wherein the plating of terminal pad base metal is done by electroplating techniques.

3. The method of making a printed circuit board according to claim 1 wherein said substrate has electrically conductive material surfacing both sides thereof.

4. The method of making a printed circuit board according to claim 3 wherein preparing the substrate includes drilling the substrate with the terminal pad pattern and chemically plating electrically conductive material on at least the resultant bore holes.

5. The method of making a printed circuit board according to claim 1 which comprises the additional step of plating electrically conductive material on the substrate after the plating-resist material is applied and before the terminal pad base metal is plated on.

6. The method of making a printed circuit board according to claim 1 wherein the electrically conductive material is copper.

7. The method of making a printed circuit board according to claim 1 wherein the terminal pad base metal includes tin and lead in solder alloy proportions.

8. The method of making a printed circuit board according to claim 1 wherein said plating-resist material and said etch-resist material are applied by silk-screen printing techniques.

* * * * *